(12) United States Patent
Kelly et al.

(10) Patent No.: US 8,853,095 B1
(45) Date of Patent: Oct. 7, 2014

(54) HYBRID HARD MASK FOR DAMASCENE AND DUAL DAMASCENE

(71) Applicant: International Business Machines Corporation, Armonk, NY (US)

(72) Inventors: James J. Kelly, Schenectady, NY (US); Tuan Anh Vo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/905,351

(22) Filed: May 30, 2013

(51) Int. Cl.
*H01L 21/4763* (2006.01)
*H01L 21/768* (2006.01)

(52) U.S. Cl.
CPC .............................. *H01L 21/76879* (2013.01)
USPC ......................................... 438/712; 438/622

(58) Field of Classification Search
USPC .................................................. 438/622, 712
See application file for complete search history.

(56) References Cited

U.S. PATENT DOCUMENTS

| | | | |
|---|---|---|---|
| 4,690,871 A | 9/1987 | Gordon | |
| 5,091,244 A | 2/1992 | Biornard | |
| 5,122,225 A | 6/1992 | Douglas | |
| 5,407,733 A | 4/1995 | Bjornard et al. | |
| 5,858,184 A | 1/1999 | Fu et al. | |
| 5,938,898 A | 8/1999 | Ando et al. | |
| 6,399,446 B1 | 6/2002 | Rangarajan et al. | |
| 6,531,404 B1 | 3/2003 | Nallan et al. | |
| 6,534,809 B2 | 3/2003 | Moise et al. | |
| 6,809,033 B1 | 10/2004 | Hui et al. | |
| 6,828,161 B2 | 12/2004 | Summerfelt et al. | |
| 7,045,070 B1 | 5/2006 | Weinrich et al. | |
| 7,687,381 B2 * | 3/2010 | Kim et al. ..................... 438/498 | |
| 7,922,824 B2 | 4/2011 | Minsek et al. | |
| 7,981,777 B1 | 7/2011 | Subramonium et al. | |
| 8,293,625 B2 * | 10/2012 | Kwon .......................... 438/479 |
| 2004/0142565 A1 * | 7/2004 | Cooney et al. ............... 438/689 |
| 2008/0244896 A1 * | 10/2008 | Bonhote et al. ............ 29/603.01 |
| 2009/0131295 A1 * | 5/2009 | Cui ............................. 510/176 |
| 2012/0028373 A1 * | 2/2012 | Belen et al. ...................... 438/3 |
| 2012/0104622 A1 * | 5/2012 | Kim et al. ..................... 257/774 |
| 2012/0286231 A1 * | 11/2012 | Saito et al. ....................... 257/4 |
| 2013/0005147 A1 * | 1/2013 | Angyal et al. ................ 438/692 |

OTHER PUBLICATIONS

Tang, T.E. et al., "Titanium Nitride Local Interconnect Technology for VLSI" IEEE Transactions on Electron Devices (Mar. 1987) pp. 682-688, vol. ED-34, No. 3.

Tompkins, H.G. et al. "Oxidation of TiN in an Oxygen Plasma Asher" Journal of Vacuum Science & Technology A: Vacuum, Surfaces, and Films (Jul./Aug. 1994) pp. 2446-2450, vol. 12, No. 4.

U.S. Appl. No. 13/741,638 Title: Titanium Oxynitride Hard Mask for Lithographic Patterning filed Jan. 15, 2013 Inventor(s): Son V. Nguyen, et al.

U.S. Appl. No. 13/741,611 Title: Lithographic Material Stack Including a Metal-Compound Hard Mask filed Jan. 15, 2013 Inventor(s): Daniel C. Edelstein.

* cited by examiner

*Primary Examiner* — Alexander Ghyka
(74) *Attorney, Agent, or Firm* — Schmeiser, Olsen & Watts; Catherine Ivers

(57) ABSTRACT

A method of forming damascene vias or dual damascene wires. The method includes using a patterned two layer hard mask wherein the patterns in the lower and upper hard mask layers are formed using a reactive ion etch process. Openings are then formed in the interlevel dielectric layer under the two layer hard mask using a second reactive ion etch process which also removes and the upper hard mask layer. The lower hard mask layer is then removed with a wet etch. Further processing completes forming the damascene vias or dual damascene wires.

21 Claims, 13 Drawing Sheets

HYBRID HARD MASK FOR DAMASCENE AND DUAL DAMASCENE

TECHNICAL FIELD

The present invention relates to the field of integrated circuit manufacture; more specifically, it relates to a hybrid hard mask process for forming single damascene vias and dual damascene wires in wiring levels of integrated circuits.

BACKGROUND

Conventional hard mask processes forming single damascene and dual damascene structures in ultra-low K dielectrics can cause damage to the metal liners and or metal contacts or ultra low K dielectrics during the hard mask removal process in capping layer retention or non retention schemes. For example, if a hard mask is removed by a wet etch, exposed underlying copper may be undercut. Or, if the hard mask is removed prior to exposing an underlying metal, the hard mask removal process followed by a metal exposing process can widen the critical dimension (CD) of the opening. Accordingly, there exists a need in the art to mitigate the deficiencies and limitations described hereinabove.

BRIEF SUMMARY

In a generic aspect of the present invention, a dual layer hard mask is used to form an opening to an underlying substrate. The lower layer of the dual layer hard mask, unlike conventional hard masks, may be removed by a wet etch. Thus, the inventive dual layer hard mask preserves a narrow CD without damaging the underlying substrate. In a preferred embodiment the dual layer hard mask may include an upper layer and a lower layer. In a preferred embodiment, the upper may be a metal nitride layer, for example titanium nitride. In a preferred embodiment, the lower layer may be a metal oxide or a metal oxynitride such as titanium oxide or titanium oxynitride.

A first aspect of the present invention is a method, comprising: forming a damascene conductor in a dielectric layer on a semiconductor substrate and a dielectric barrier layer on a top surface of the damascene conductor and a top surface of the dielectric layer; forming a dielectric stack on a top surface of the dielectric barrier layer, the dielectric stack comprising an interlevel dielectric layer on a top surface of the dielectric barrier layer; forming a lower hard mask layer on a top surface of the dielectric stack and an upper hard mask layer on a top surface of the lower hard mask layer; using a first reactive ion etch selective to the upper and lower hard mask layers over the interlevel dielectric layer, forming a via opening through the upper hard mask layer and the lower hard mask layer to a top surface of the dielectric stack; using a second reactive ion etch selective to the upper hard mask layer and the interlevel dielectric layer over the dielectric barrier layer, extending the via opening through the interlevel dielectric layer to the dielectric barrier layer; removing the lower hard mask layer using a wet etch; using a third reactive ion etch selective to the dielectric barrier layer over the damascene conductor and the interlevel dielectric layer to the damascene conductor, extending the via opening through the dielectric barrier layer to the damascene conductor; and filling the via opening with an electrical conductor.

A second aspect of the present invention is a method, comprising: forming a damascene conductor in a dielectric layer on a semiconductor substrate and a dielectric barrier layer on a top surface of the damascene conductor and a top surface of the dielectric layer; forming a dielectric stack on a top surface of the dielectric barrier layer, the dielectric comprising an interlevel dielectric layer on a top surface of the dielectric barrier layer; forming a lower hard mask layer on a top surface of the dielectric stack and an upper hard mask layer on a top surface of the lower hard mask layer; using a first reactive ion etch selective to the upper and lower hard mask layers over the interlevel dielectric layer, forming a via opening through the upper hard mask layer and the lower hard mask layer to a top surface of the dielectric stack; using a second reactive ion etch selective to the upper hard mask layer and the interlevel dielectric layer over the dielectric barrier layer, extending the via opening through the interlevel dielectric layer to the dielectric barrier layer; removing the lower hard mask layer using a wet etch; using a third reactive ion etch selective to the interlevel dielectric layer over the dielectric barrier layer, etching a trench part way through the interlevel dielectric layer, the via opening exposed in a bottom of the trench; using a fourth reactive ion etch selective to the dielectric barrier layer over the damascene conductor and the interlevel dielectric layer to the damascene conductor, extending the via opening through the dielectric barrier layer to the damascene conductor; and filling the trench and via opening with an electrical conductor.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Figure 1A:
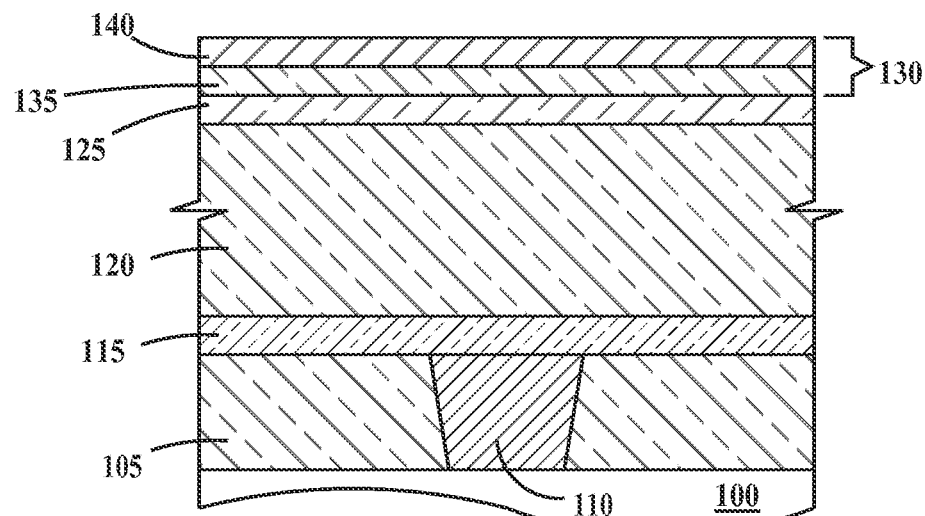
FIGS. 1A through 1G are cross-sections showing fabrication of a damascene via according to an embodiment of the present invention using a first exemplary dielectric stack.

The embodiments of the present invention utilize a patterned two layer hard mask wherein the patterns in the lower and upper hard mask layers are formed using a reactive ion etch (RIE) process. Openings are then formed in the interlevel dielectric layer under the two layer hard mask using a second RIE which also removes and the upper hard mask layer. The lower hard mask layer is then removed with a wet etch. Further processing completes forming damascene vias or dual damascene wires.

A photolithographic process is one in which a photoresist layer is applied to a surface of a substrate, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After processing (e.g., an etch or an ion implantation), the patterned photoresist is removed. The photoresist may also be left in place and removed by the etch process. The photoresist layer may optionally be baked at one or more of the following steps: prior to exposure to actinic radiation, between exposure to actinic radiation and development, after development.

A damascene process is one in which wire trenches or via openings are formed in a dielectric layer, an electrical conductor of sufficient thickness to fill the trenches is formed in the trenches and on a top surface of the dielectric. A chemical-mechanical-polish (CMP) process is performed to remove excess conductor from the surface of the dielectric layer and make the surface of the conductor coplanar with the top surface of the dielectric layer to form damascene wires (or damascene vias). When only a trench and a wire or a via opening and a via is formed the process is called single-damascene.

A via first dual-damascene process is one in which via openings are formed through the entire thickness of the dielectric layer followed by formation of trenches part of the way through the dielectric layer in any given cross-sectional view. A trench first dual-damascene process is one in which trenches are formed part way through the thickness of a dielectric layer followed by formation of vias inside the trenches the rest of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is formed on a top surface of the dielectric layer and a CMP process is performed to make the surface of the conductor in the trench coplanar with the top surface of the dielectric layer to form dual-damascene wires having integral vias.

When a metal nitride hardmask layer is used to define damascene and dual damascene wires, vias and contacts, because of the damage metal nitride removal causes to the underlying dielectric and metal exposed in the openings, the metal hard mask is left in place during the damascene/dual-damascene metal fill processes and removed by the CMP process. However, for via width dimensions of 15 nm and less it has been found that voids (e.g., copper plating voids) are formed in the damascene wires and vias using this sequence. To avoid void formation, the metal hard mask must be removed prior to metal filling in order allow tapering of the top of the via and trench profiles which results in improved metal filling that minimizes or eliminates voids in the wires, vias and contacts. However it has been found that it is extremely difficult to remove a hard mask comprising metal nitride on the top surfaces of the underlying dielectric layer (especially ultra low K (dielectric constant) dielectric layer) and the formed damascene and dual damascene wires and contacts (especially the conductive liners). An ultra low K (ULK) dielectric material has a K value of 2.7 or less. Therefore, the embodiments of the present invention use a metal oxide or metal oxynitride hard mask layer under the metal nitride hardmask layer. The metal oxide or metal oxynitride hard mask layer is removed using a dilute hydrofluoric (HF) acid wet etch etchant. In one example, the wet etchant comprises a solution of 500 to 1700 parts $H_2O$ to 1 part of 49% HF by volume (wherein the 49% HF is 49% HF by weight in $H_2O$). In one example, the wet etchant comprises a solution of 1300 to 1500 parts $H_2O$ to 1 part of 49% HF by volume (wherein the 49% HF is 49% HF by weight in $H_2O$). In one example, the wet etchant comprises a mixture of a solution of 1000 to 1500 parts $H_2O$ to 1 part of 49% HF by volume (wherein the 49% HF is 49% HF by weight in $H_2O$) and citric acid at a temperature between about 22° C. and about 70° C. preferred and between about 50° C. and 70° C. more preferred, thus improving the via or wire/via edge profiles, allowing improved metal fill and increased reliability.

FIGS. 1A through 1G are cross-sections showing fabrication of a damascene via according to an embodiment of the present invention using a first exemplary dielectric stack. In FIG. 1A formed on a semiconductor substrate 100 is a dielectric layer 105 including a damascene conductor 110. Examples of damascene conductors include electrically conductive contacts, electrically conductive vias and electrically conductive wires. A damascene conductor is defined as an electrically conductive structure embedded in a dielectric layer wherein a top surface of the damascene conductor is coplanar with the top surface of the dielectric layer it is embedded in. Damascene conductors (i.e., wires, vias and contacts) are formed using the damascene processes described supra.

The top surfaces of dielectric layer 105 and damascene conductor 110 are coplanar. Formed on the top surfaces of dielectric layer 105 and damascene conductor 110 is a dielectric barrier layer 115. Formed on a top surface of dielectric barrier layer 115 is an interlevel dielectric layer (ILD) 120. Formed on a top surface of ILD layer 120 is a dielectric capping layer 125. Formed on a top surface of dielectric capping layer 125 is a hard mask layer 130 comprising a lower hard mask layer 135 formed on the top surface of dielectric capping layer 125 and an upper hard mask layer 140 formed on a top surface of lower hard mask layer 135. In one example, damascene conductor 110 comprises tungsten or copper or copper and a metal nitride. In one example, dielectric barrier layer 115 is NBLok (SiC(N,H)). In one example, dielectric barrier layer 115 is about 10 nm to about 30 nm thick. In one example, dielectric barrier layer 115 is a diffusion barrier to copper. In one example, ILD layer 120 is a ULK material. Examples of ULK include but are not limited to porous hydrogen silsesquioxane polymer (HSQ), porous methyl silsesquioxane polymer (MSQ), porous (methyl doped silica or $SiO_x(CH_3)_y$, or $SiC_xO_yH_y$ or SiOCH), octametylcyclotetrailoxane (OMCTS) based materials and tetrametylcyclotetrailoxane (TMCTS) based materials. In one example, ILD layer 120 is about 80 nm to 120 nm thick. In one example, dielectric capping layer 125 is tetraethylorthosilicate (TEOS). In one example, dielectric capping layer 125 has a thickness between about 10 nm and about 40 nm. In one example, dielectric capping layer 125 has a thickness between about 10 nm and about 20 nm. In one example, lower hard mask layer 135 is a metal oxide or metal oxynitride. In one example, lower hard mask layer 135 is titanium oxide or titanium oxynitride. In one example, lower hard mask layer 135 is between about 10 nm and about 20 nm thick. In one example, upper hard mask layer 140 is a metal nitride. In one example, upper hard mask layer 140 is titanium nitride. In one example, upper hard mask layer 140 is between about 10 nm and about 20 nm thick. It is important that lower hard mask layer 135 be etchable by a wet etch process.

Figure 1B:
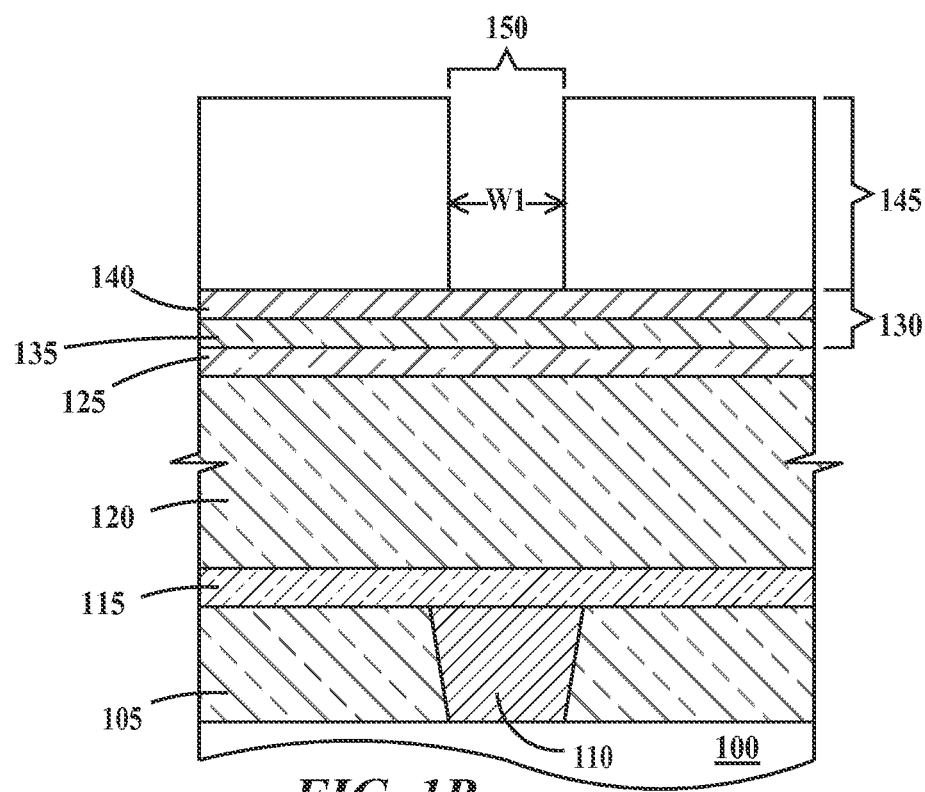

In FIG. 1B, a patterned photoresist layer 145 having an opening 150 is formed on the top surface of upper hard mask layer 140. In one example, opening has a width W1 of about 20 nm to about 60 nm.

Figure 1C:
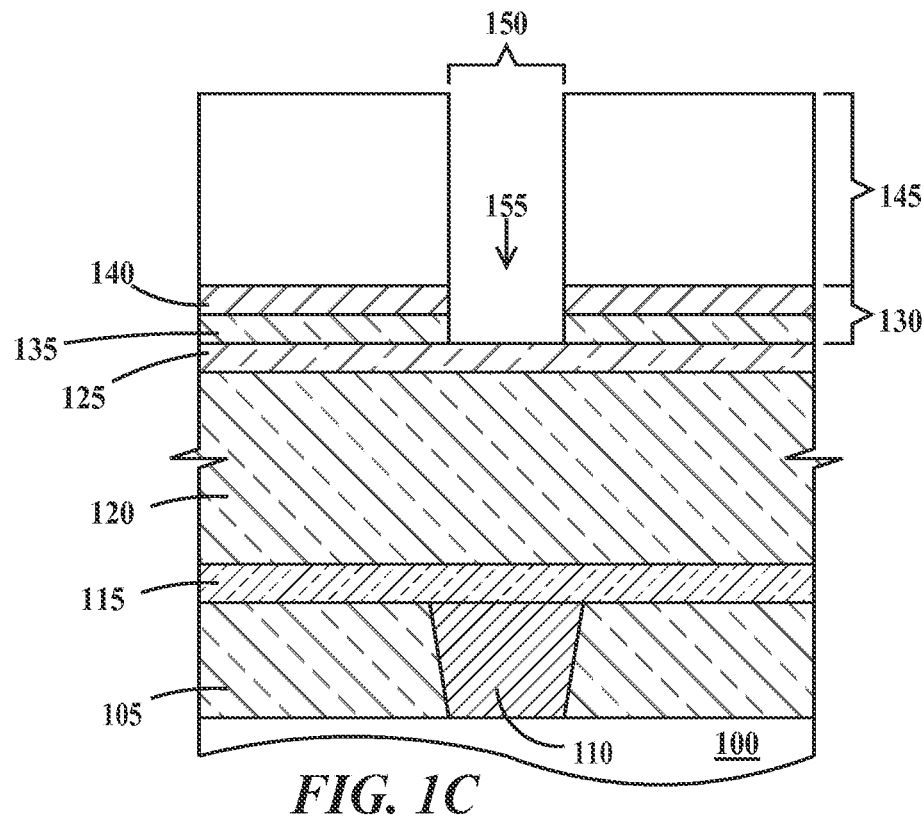

In FIG. 1C, a first RIE is performed which forms a via opening 155 through opening 150 in hard mask 130. Dielectric capping layer 125 is exposed in the bottom of via opening 155. The first RIE process is selective to upper and lower hard mask layers 140 and 135 over dielectric capping layer 125. The terminology "selective to A over B" is defined as A is etched preferentially relative to B. In one example, there is little etching (i.e., about 10% thickness loss or less) to no etching of dielectric capping layer 125 by the first RIE. The first RIE may remove some of patterned photoresist layer 145.

Figure 1D:
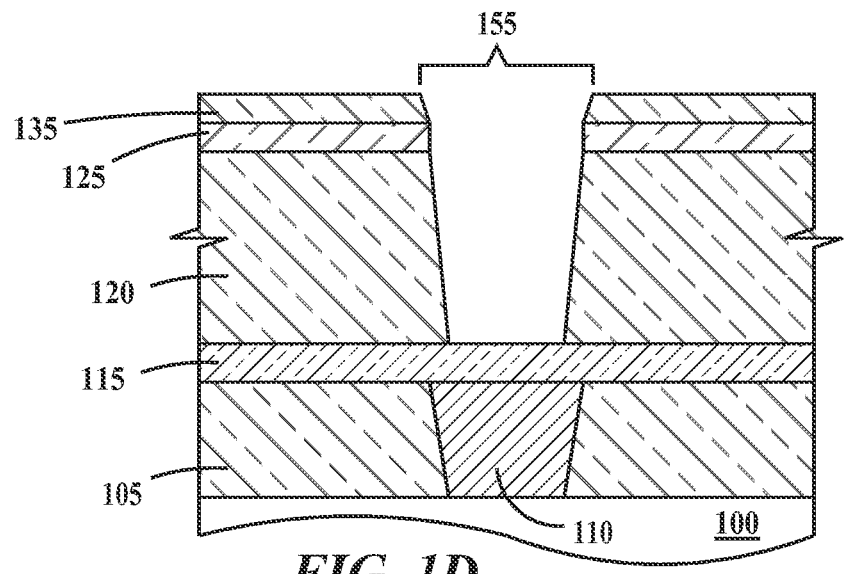

In FIG. 1D, a second RIE is performed to extend via opening 155 through dielectric capping layer 125 and ILD layer 120. Dielectric barrier layer 115 is exposed in the bottom of via opening 155. The second RIE process is selective to upper hard mask layer 140, dielectric capping layer 125 and ILD layer 120 over dielectric barrier layer 115 and lower hard mask layer 135. In one example, there is little etching (i.e., about 10% thickness loss or less) to no etching of dielectric barrier layer 115 by the second RIE. In one example, there is little etching (i.e., about 10% thickness loss or less) to no etching of lower hard mask layer 135 by the second RIE. The second RIE also removes all remaining patterned photoresist layer 145 and all of remaining upper hard mask layer 140 (see FIG. 1C).

Figure 1E:
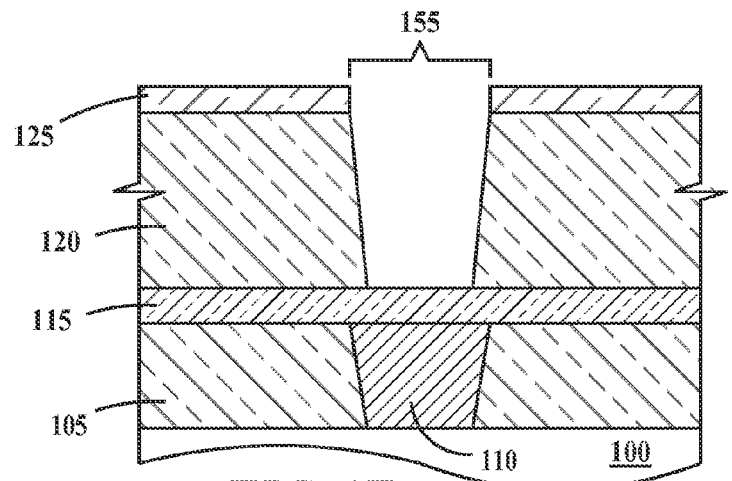

In FIG. 1E, a wet etch is performed to remove lower hard mask layer 135 (see FIG. 1D). The wet etch is selective to lower hard mask layer 135 over dielectric capping layer 125, ILD layer 120 and dielectric barrier layer 115. In one example, there is little etching (i.e., about 10% thickness loss or less) to no etching of dielectric barrier layer 115 by the second RIE. In one example, there is little etching (i.e., about 5% thickness loss or less) to no etching of dielectric capping layer 125 by the wet etch. In one example, there is little etching (i.e., about 3% thickness loss or less) to no etching of ILD layer 120 by the wet etch. In one example, there is little etching (i.e., about 10% thickness loss or less) to no etching of dielectric barrier layer 115 by the wet etch. In one example, the wet etch comprises a solution of 500 to 1700 parts $H_2O$ to 1 part of 49% HF by volume (wherein the 49% HF is 49% HF by weight in $H_2O$). In one example, the wet etch comprises a solution of 1300 to 1500 parts $H_2O$ to 1 part of 49% HF by volume (wherein the 49% HF is 49% HF by weight in $H_2O$). In one example, the wet etch comprises a mixture of a solution of 1000 to 1500 parts $H_2O$ to 1 part of 49% HF by volume (wherein the 49% HF is 49% HF by weight in $H_2O$) and citric acid at a temperature between about 22° C. and about 70° C. preferred and between about 50° C. and 70° C. more preferred.

Figure 1F:
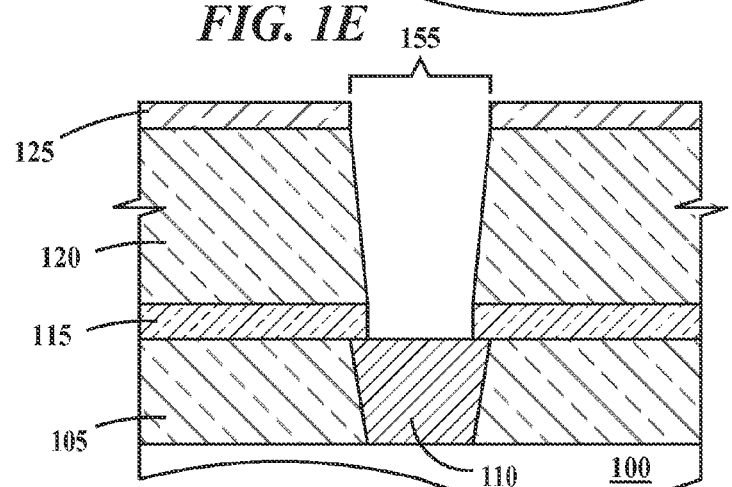

In FIG. 1F, a third RIE is performed to extend via opening 155 through dielectric barrier layer 115. Damascene conductor 110 is exposed in the bottom of via opening 155. The third RIE process is selective to dielectric barrier layer 115 over damascene conductor 110, ILD layer 120 and dielectric capping layer 125. In one example, there is little etching (i.e., about 10% thickness loss or less) to no etching of damascene conductor 110 by the third RIE. The third RIE can improve the via opening profile.

Figure 1G:
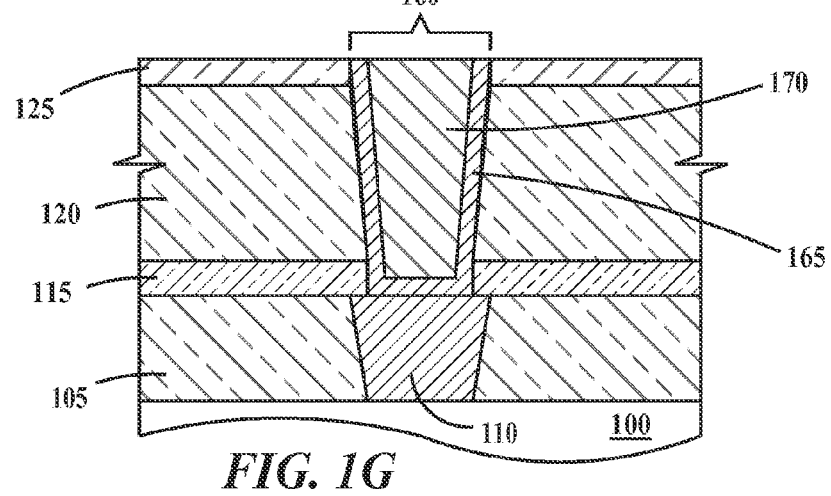

In FIG. 1G, an electrically conductive via 160 is formed in (and completely filling) via opening 155 (see FIG. 1F) using a damascene/CMP process described supra. Via 160 includes an electrically conductive liner 165 and a core conductor 170. In one example, liner 165 comprises a layer of tantalum on the core conductor and a layer of tantalum nitride on the tantalum layer. In one example, core conductor 170 comprises copper.

Optionally, an additional RIE may be performed between FIGS. 1F and 1G to etch back any dielectric capping layer 125 that may extend into via opening 155 due to undercut of ILD layer 120 by the various RIE etch steps. This will produce a via opening profile that will further improve the liner formation and core fill processes and further improve electromigration reliability by removing sharp corners. In one example, there is little etching (i.e., about 10% thickness loss or less) to no etching of damascene conductor 110 by this additional RIE.

FIGS. 2A through 2G are cross-sections showing fabrication of a damascene via according to an embodiment of the present invention using a second exemplary dielectric stack. FIGS. 2A through 2G are similar to respective FIGS. 1A through 1G except there is no dielectric capping layer 125 (see FIG. 1A).

Figure 2A:
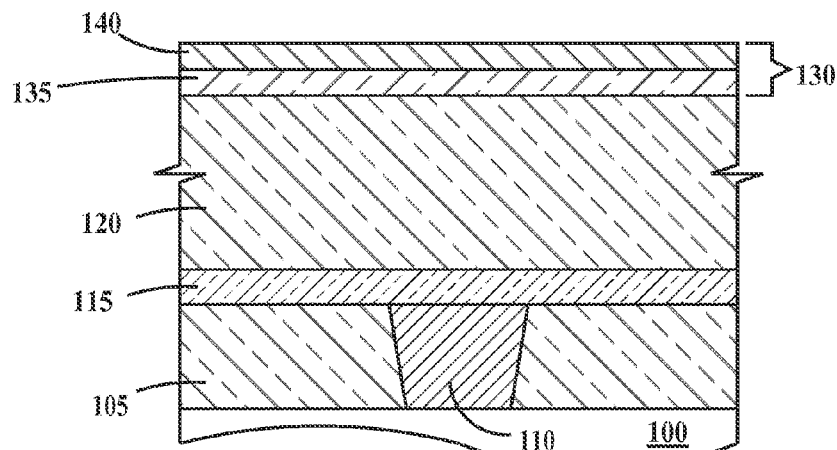
FIGS. 2A through 2G are cross-sections showing fabrication of a damascene via according to an embodiment of the present invention using a second exemplary dielectric stack.

In FIG. 2A formed on semiconductor substrate 100 is a dielectric layer 105 including damascene conductor 110. The top surfaces of dielectric layer 105 and damascene conductor 110 are coplanar. Formed on the top surfaces of dielectric layer 105 and damascene conductor 110 is dielectric barrier layer 115. Formed on the top surface of dielectric barrier layer 115 is an interlevel dielectric layer (ILD) 120. Formed on a top surface of ILD layer 120 is a hard mask layer 130 comprising a lower hard mask layer 135 formed on the top surface of ILD layer 120 and an upper hard mask layer 140 formed on a top surface of lower hard mask layer 135. Materials and thicknesses of the various layers has been described supra with respect to FIG. 1A.

Figure 2B:
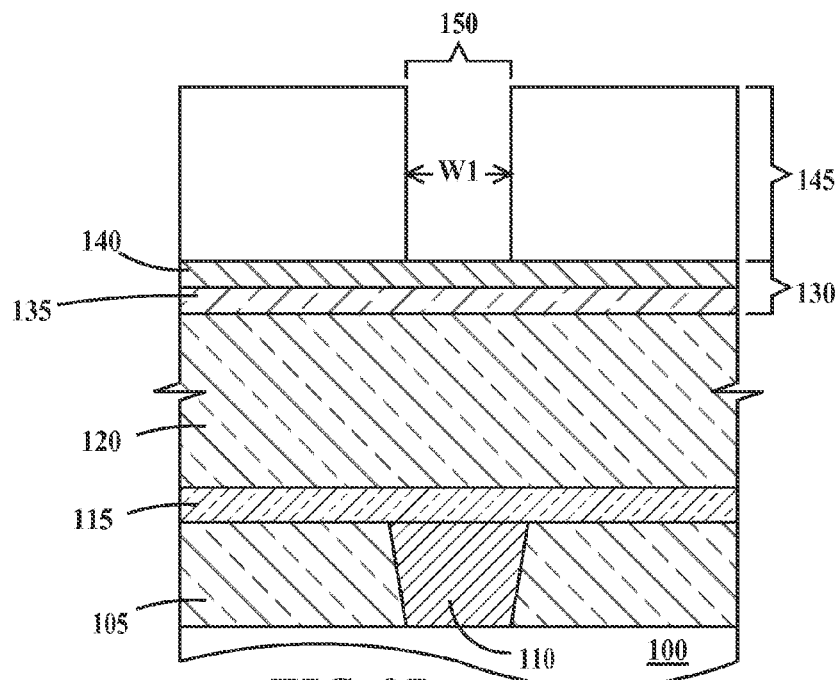

In FIG. 2B, a patterned photoresist layer 145 having an opening 150 is formed on the top surface of upper hard mask layer 140. In one example, opening has a width W1. In one example, W1 is between about 20 nm and about 60 nm. In one example, W1 is between about 10 nm and about 40 nm.

Figure 2C:
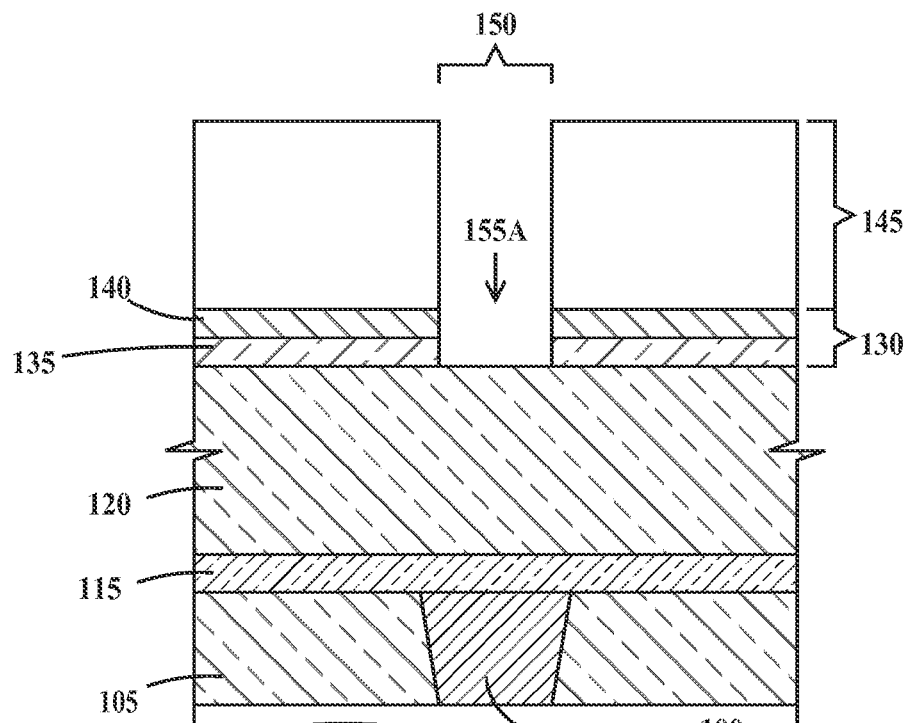

In FIG. 2C, the first RIE is performed which forms a via opening 155 through opening 150 in hard mask 130. ILD layer 120 is exposed in the bottom of via opening 155A. The first RIE process is selective to upper and lower hard mask layers 140 and 135 over ILD layer 120. In one example, there is little etching (i.e., about 10% thickness loss or less) to no etching of ILD layer 120 by the first RIE. The first RIE may remove some of patterned photoresist layer 145.

Figure 2D:
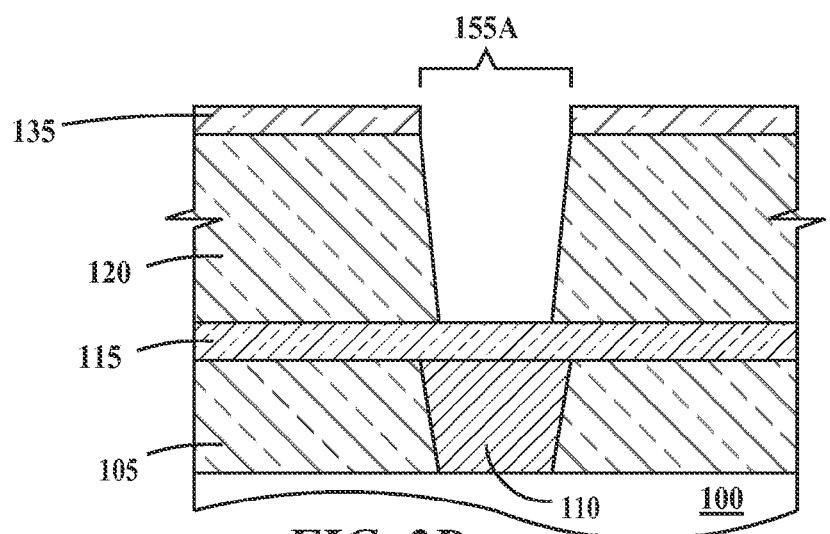

In FIG. 2D, a second RIE is performed to extend via opening 155A through ILD layer 120. Dielectric barrier layer 115 is exposed in the bottom of via opening 155A. The second RIE process is selective to upper hard mask layer 140 and ILD layer 120 over dielectric barrier layer 115 and lower hard mask layer 135. In one example, there is little etching (i.e., about 10% thickness loss or less) to no etching of dielectric barrier layer 115 by the second RIE. In one example, there is little etching (i.e., about 10% thickness loss or less) to no etching of lower hard mask layer 135 by the second RIE. The second RIE also removes all remaining patterned photoresist layer 145 and all of remaining upper hard mask layer 140 (see FIG. 2C).

Figure 2E:
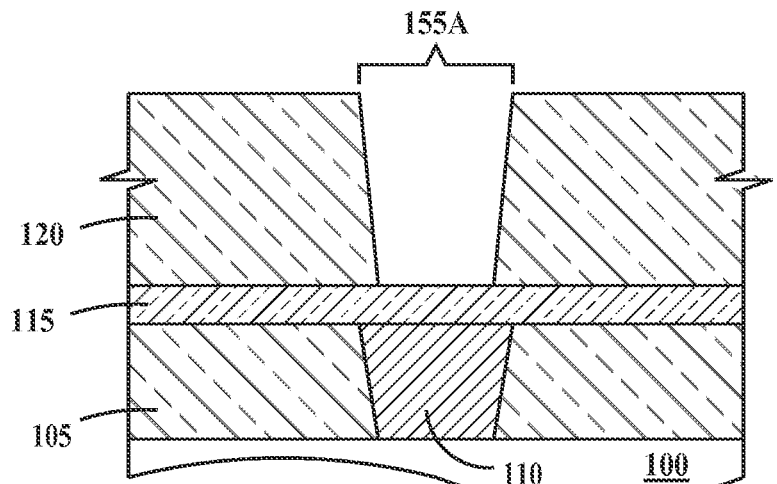

In FIG. 2E, a wet etch is performed to remove lower hard mask layer 135 (see FIG. 1D). The wet etch is selective to lower hard mask layer 135 over ILD layer 120 and dielectric barrier layer 115. In one example, there is little etching (i.e., about 10% thickness loss or less) to no etching of dielectric barrier layer 115 by the second RIE. In one example, there is little etching (i.e., about 10% thickness loss or less) to no etching of ILD layer 120 by the wet etch. In one example, there is little etching (i.e., about 10% thickness loss or less) to no etching of dielectric barrier layer 115 by the wet etch. In one example, the wet etch comprises a solution of 500 to 1700 parts $H_2O$ to 1 part of 49% HF by volume (wherein the 49% HF is 49% HF by weight in $H_2O$). In one example, the wet etch comprises a solution of 1300 to 1500 parts $H_2O$ to 1 part of 49% HF by volume (wherein the 49% HF is 49% HF by weight in $H_2O$). In one example, the wet etch comprises a mixture of a solution of 1000 to 1500 parts $H_2O$ to 1 part of 49% HF by volume (wherein the 49% HF is 49% HF by weight in $H_2O$) and citric acid at a temperature between about 22° C. and about 70° C. preferred and between about 50° C. and 70° C. more preferred.

Figure 2F:
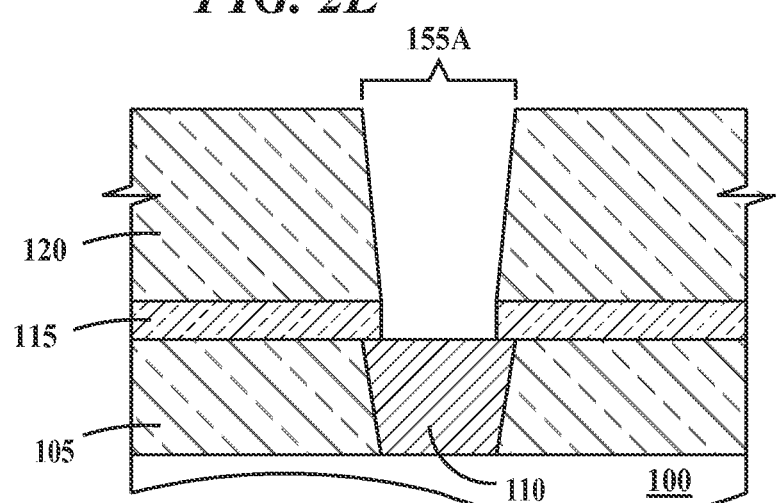

In FIG. 2F, a third RIE is performed to extend via opening 155A through dielectric barrier layer 115. Damascene conductor 110 is exposed in the bottom of via opening 155A. The third RIE process is selective to dielectric barrier layer 115 over damascene conductor 110 and ILD layer 120. In one example, there is little etching (i.e., about 10% thickness loss or less) to no etching of damascene conductor 110 by the third RIE.

Figure 2G:
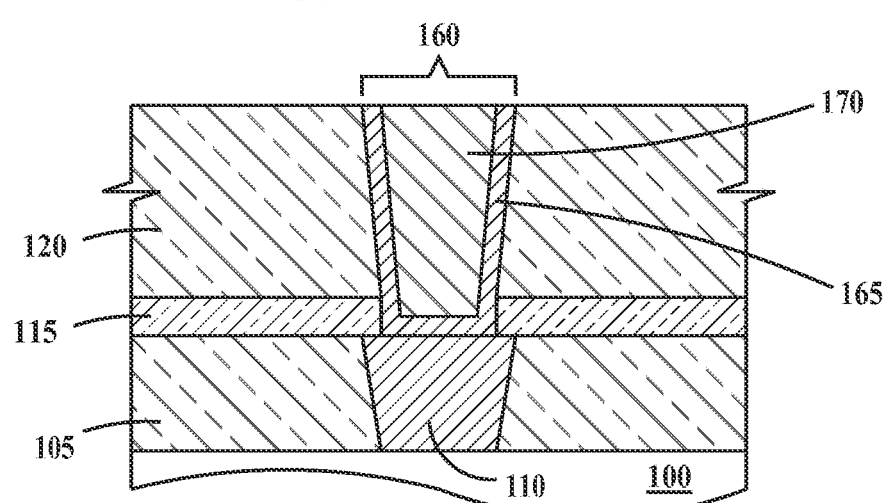

In FIG. 2G, electrically conductive via 160 is formed in (and completely filling) via opening 155A (see FIG. 2F) using a damascene/CMP process described supra. Via 160 has been described supra with respect to FIG. 1G.

Figure 3A:
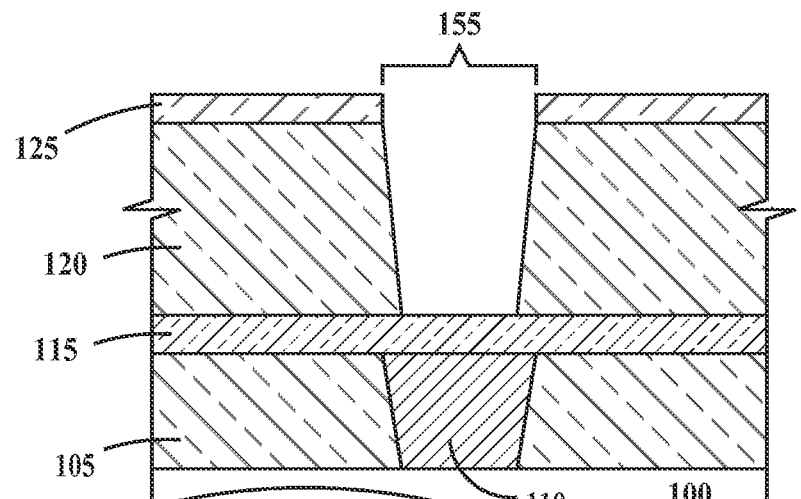
FIGS. 3A through 3E are cross-sections showing fabrication of a dual damascene wire according to an embodiment of the present invention using the first exemplary dielectric stack.

FIGS. 3A through 3E are cross-sections showing fabrication of a dual damascene wire according to an embodiment of the present invention using the first exemplary dielectric stack. FIG. 3A is the same as FIG. 1E. In FIG. 3A, via opening 155 has been formed through dielectric capping layer 125 and ILD layer 120, but not through dielectric barrier layer 115. Only the first and second RIEs have been performed.

Figure 3B:
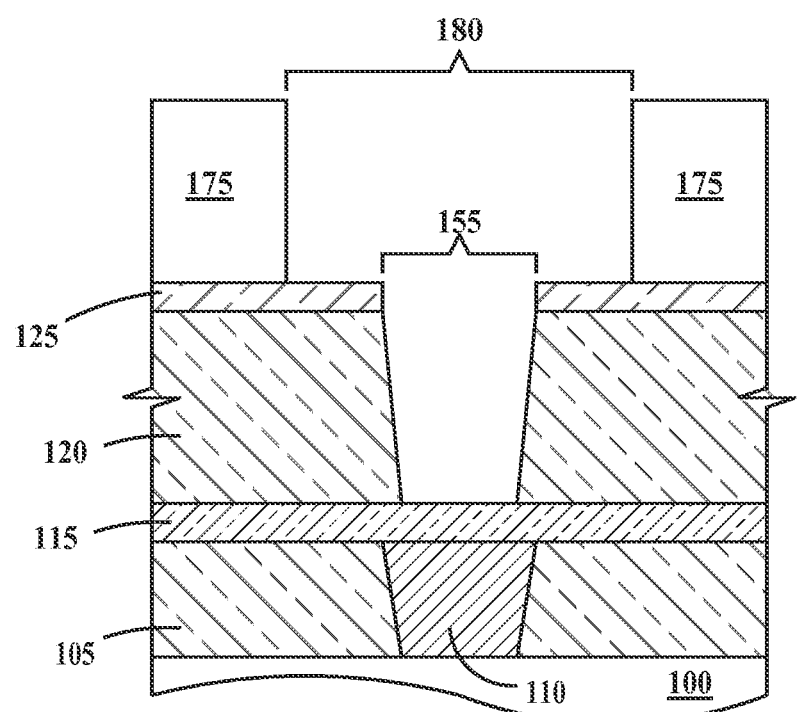

In FIG. 3B, a second patterned photoresist layer 175 having a opening 180 is formed on the top surface of dielectric capping layer 125.

Figure 3C:
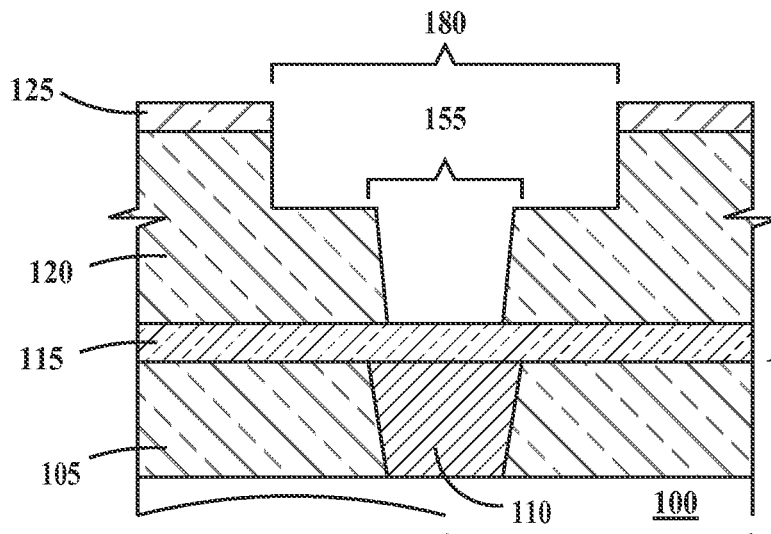

In FIG. 3C, a third RIE is performed to form a trench 180 extending completely through dielectric capping layer 125 and into but not completely through ILD layer 120. This third RIE process (different from the third RIE of FIG. 1G) is selective to ILD layer 120 and dielectric capping layer 125 over dielectric barrier layer 115. In one example, there is little etching (i.e., about 10% thickness loss or less) to no etching of dielectric barrier layer 115 by the third RIE.

Figure 3D:
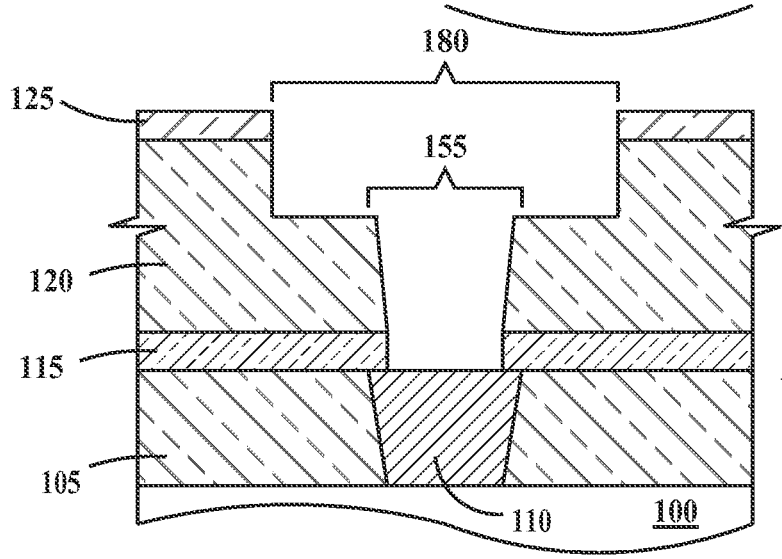

In FIG. 3D, a fourth RIE is performed to extend via opening 155 through dielectric barrier layer 115. Wire or contact 115 is exposed in the bottom of via opening 155. The fourth RIE process is selective to dielectric barrier layer 115 over damascene conductor 110, ILD layer 120 and dielectric capping layer 125. In one example, there is little etching (i.e., about 10% thickness loss or less) to no etching of damascene conductor 110 by the fourth RIE. The fourth RIE removes any remaining second patterned photoresist layer 175. Alternatively, a wet or dry (i.e., plasma) process may be used to remove any remaining second patterned photoresist layer 175.

Figure 3E:
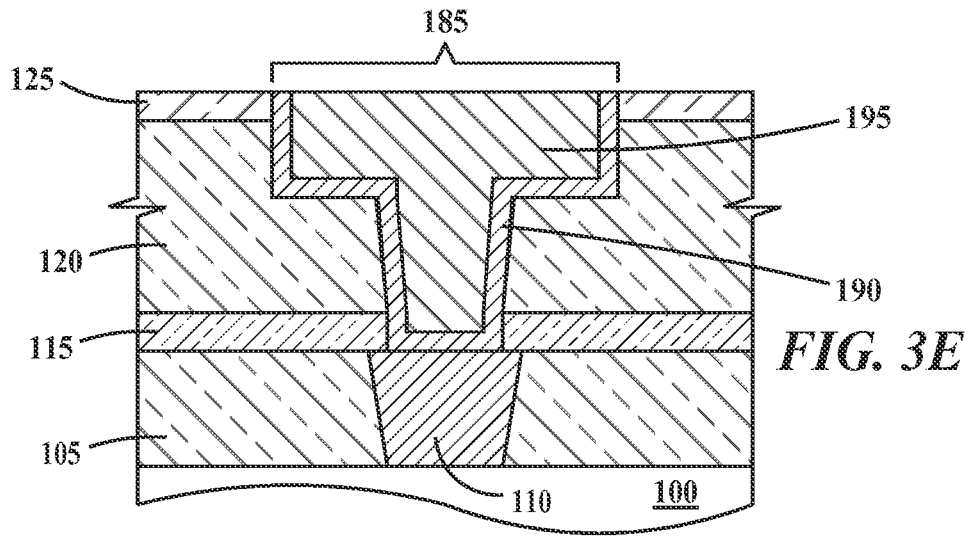

In FIG. 3E, electrically conductive dual damascene wire 185 is formed in (and completely filling) via opening 155 and trench 180 (see FIG. 3D) using a damascene/CMP process described supra. Dual damascene wire includes and electrically conductive liner 190 and a core conductor 195. In one example, liner 190 comprises a layer of tantalum on the core conductor and a layer of tantalum nitride on the tantalum layer. In one example, core conductor 195 comprises copper.

Figure 4A:
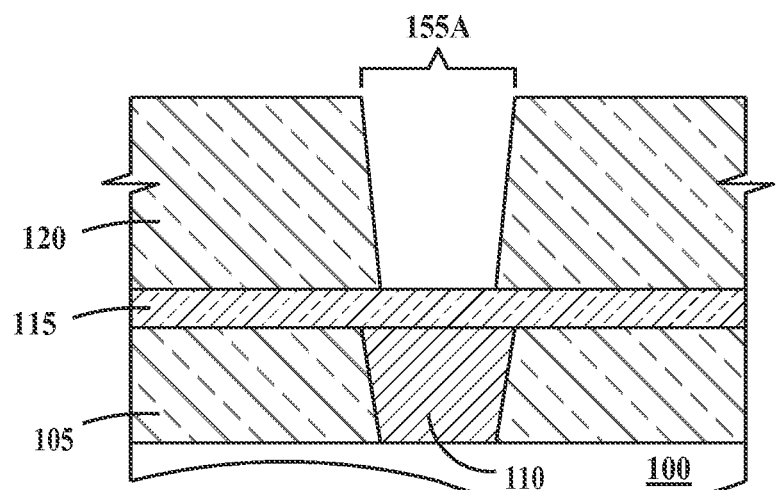
FIGS. 4A through 4E are cross-sections showing fabrication of a dual damascene via according to an embodiment of the present invention using the second exemplary dielectric stack.

FIGS. 4A through 4E are cross-sections showing fabrication of a dual damascene via according to an embodiment of the present invention using the second exemplary dielectric stack. FIG. 4A is the same as FIG. 2E. FIGS. 4A through 4E differs from FIGS. 3A through 3E only in the fact that there is no dielectric capping layer 125 (see FIG. 3A) in FIGS. 4A through 4E. In FIG. 4A, a via opening 155A has been formed through dielectric capping layer 125 and ILD layer 120, but not through dielectric barrier layer 115. Only the first and second RIEs have been performed.

Figure 4B:
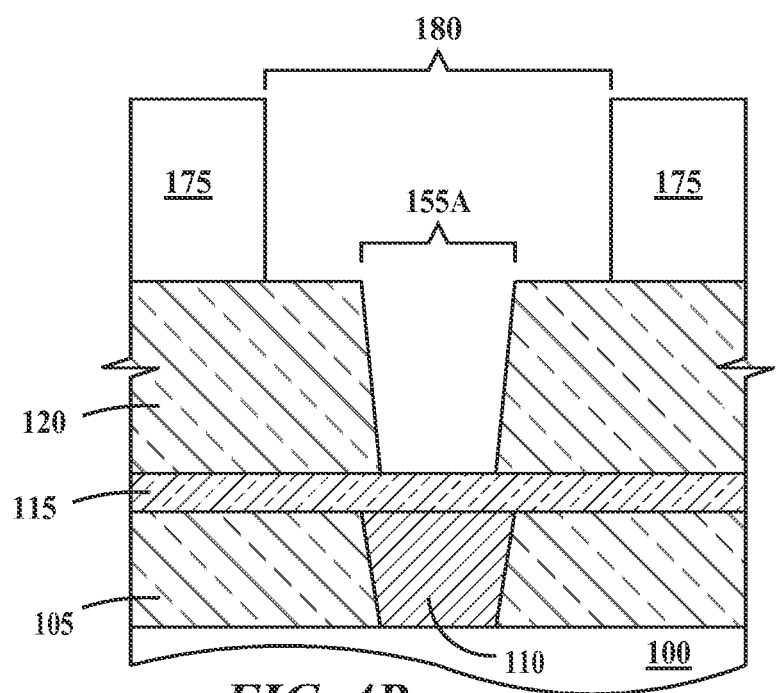

In FIG. 4B, second patterned photoresist layer 175 having opening 180 is formed on the top surface of ILD layer 120.

Figure 4C:
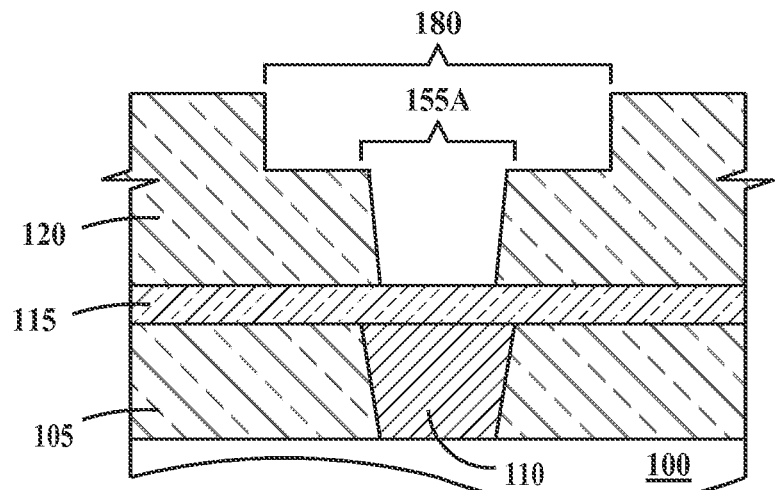

In FIG. 4C, a third RIE is performed to form a trench 180 extending into but not completely through ILD layer 120. This third RIE process (different from the third RIE of FIG. 2G) is selective to ILD layer 120 over dielectric barrier layer 115. In one example, there is little etching (i.e., about 10% thickness loss or less) to no etching of dielectric barrier layer 115 by the third RIE.

Figure 4D:
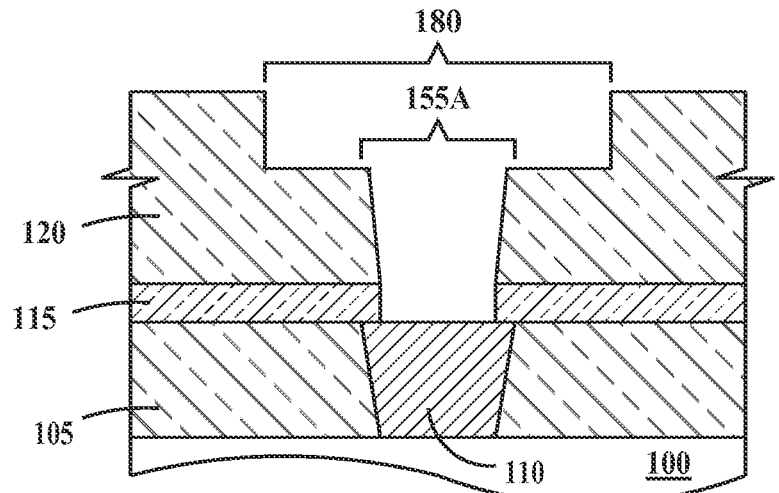

In FIG. 4D, a fourth RIE is performed to extend via opening 155A through dielectric barrier layer 115. Wire or contact 115 is exposed in the bottom of via opening 155A. The fourth RIE process is selective to dielectric barrier layer 115 over damascene conductor 110, ILD layer 120 and dielectric capping layer 125. In one example, there is little etching (i.e., about 10% thickness loss or less) to no etching of damascene conductor 110 by the fourth RIE. The fourth RIE removes any remaining second patterned photoresist layer 175. Alternatively, a wet or dry (i.e., plasma) process may be used to remove any remaining second patterned photoresist layer 175.

Figure 4E:
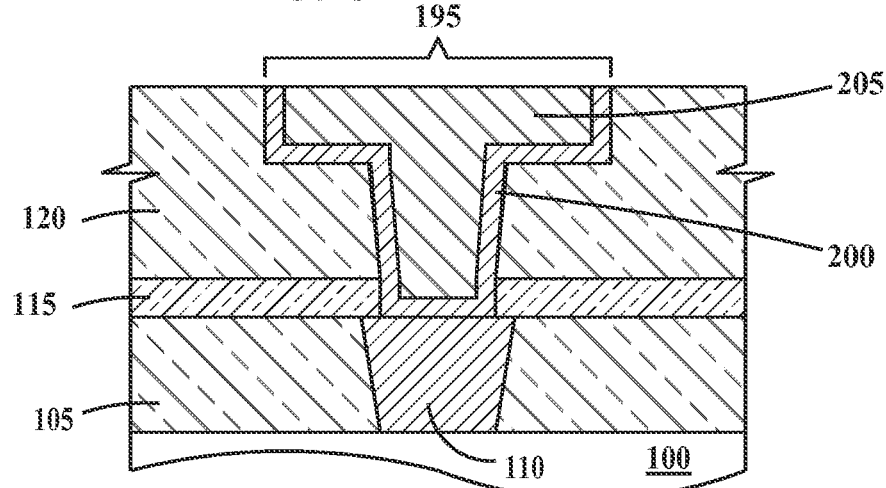

In FIG. 4E, electrically conductive dual damascene wire 195 is formed in (and completely filling) via opening 155A and trench 180 (see FIG. 4D) using a damascene/CMP process described supra. Dual damascene wire 195 includes and electrically conductive liner 200 and a core conductor 205. In one example, liner 200 comprises a layer of tantalum on the core conductor and a layer of tantalum nitride on the tantalum layer. In one example, core conductor 205 comprises copper.

FIGS. 5A through 5F are cross-sections showing an alternative method of defining a via opening according to an embodiment of the present invention using the second exemplary dielectric stack. In FIGS. 5A-5E three hardmask layers instead of two are used and the opening in the hardmask layer is defined by a photolithographically formed opening in an additional hardmask layer instead of directly by a photolithographic process as in FIGS. 1C and 2C.

Figure 5A:
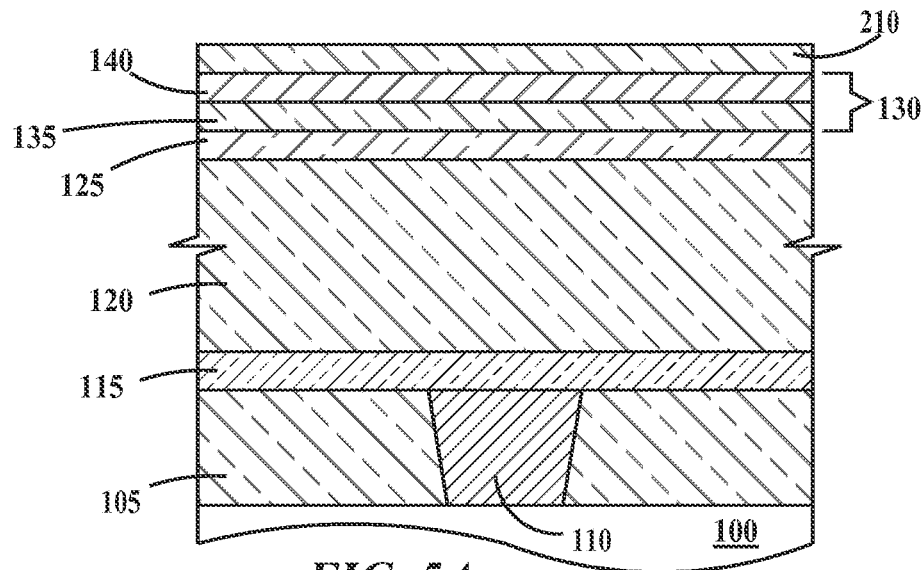
FIGS. 5A through 5F are cross-sections showing an alternative method of defining a via opening according to an embodiment of the present invention using the second exemplary dielectric stack.
Figure 5B:
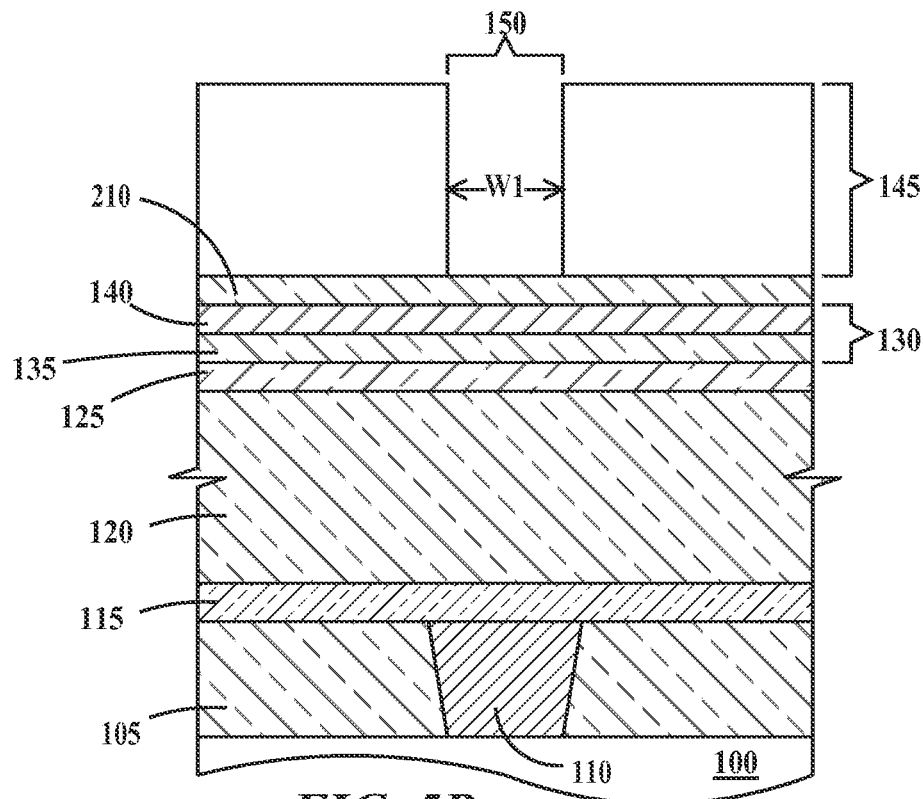
Figure 5C:
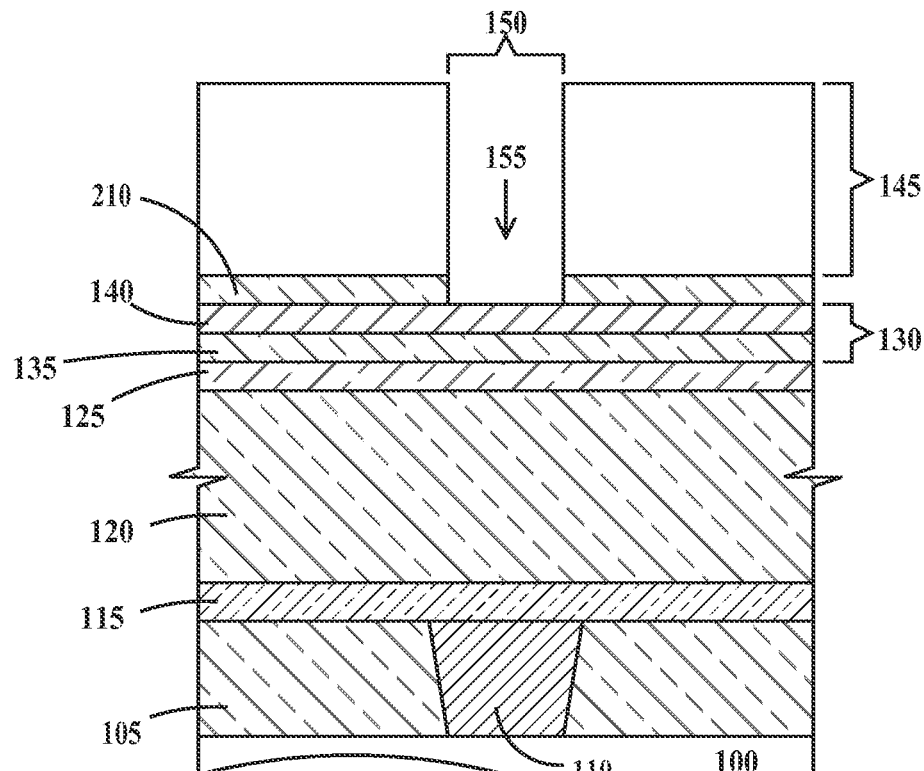
Figure 5D:
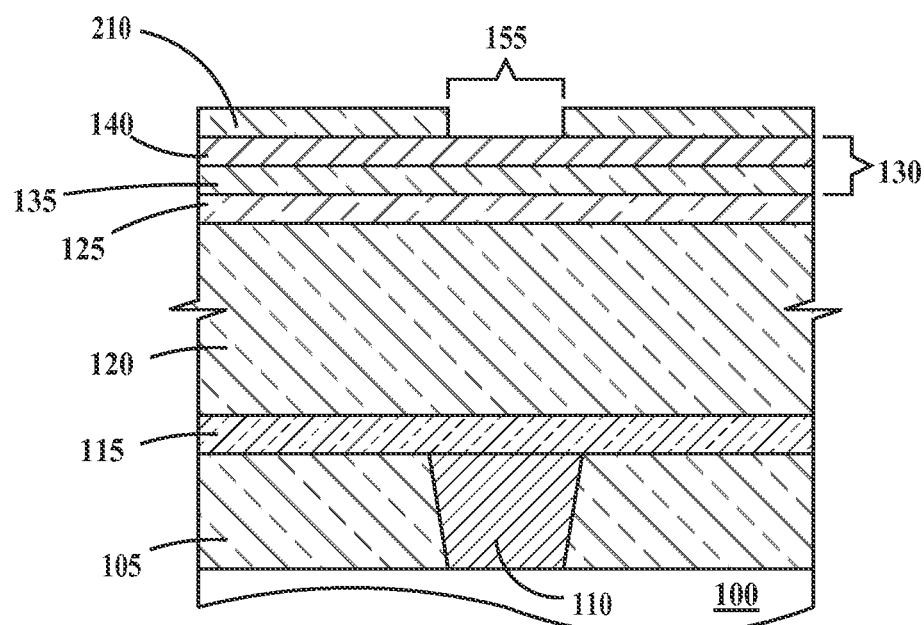
Figure 5E:
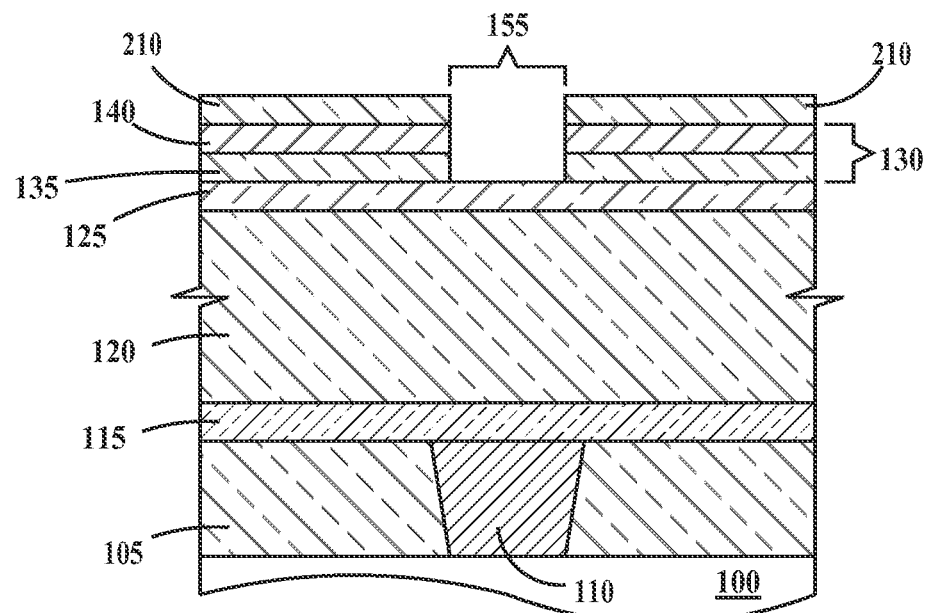
Figure 5F:
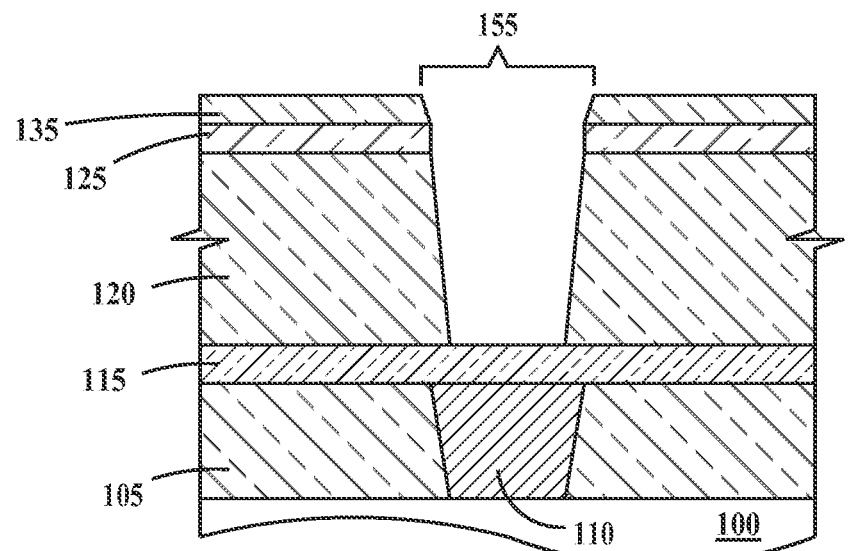

In FIG. 5A, an additional hardmask layer 210 is form on the top surface of upper hardmask layer 140 of hardmask layer 130. In FIG. 5B, patterned photoresist layer 145 is formed on the top surface of additional hardmask layer 210. In FIG. 5C, an additional RIE is used to form via opening 155 in additional hardmask layer 210. Additional RIE is selective to additional hardmask layer to upper hardmask layer 140. In one example additional hardmask layer is TEOS. In one example, additional hardmask layer 210 has a thickness between about 10 nm and about 40 nm. In one example, additional hardmask layer 210 has a thickness between about 10 nm and about 20 nm. In one example, there is little etching (i.e., about 10% thickness loss or less) to no etching of upper hardmask layer 140 by the additional RIE. The additional RIE may remove some of patterned photoresist layer 145. In FIG. 5D, patterned photoresist layer 145 is removed, for example, using a oxygen plasma process. In FIG. 5E, the first RIE described supra with respect to FIG. 1C is performed. The first RIE process is selective to upper and lower hard mask layers 140 and 135 over additional hardmask layer 210 and dielectric capping layer 125. In one example, there is little etching (i.e., about 10% thickness loss or less) to no etching of dielectric capping layer 125 and additional hardmask layer 210 by the first RIE. In FIG. 5F, the first RIE described supra with respect to FIG. 1D is performed. The second RIE process is selective to upper hard mask layer 140, dielectric capping layer 125 and ILD layer 120 over dielectric barrier layer 115 and lower hard mask layer 135. In one example, there is little etching (i.e., about 10% thickness loss or less) to no etching of dielectric barrier layer 115 by the second RIE. In one example, there is little etching (i.e., about 10% thickness loss or less) to no etching of lower hard mask layer 135 by the second RIE. The second RIE also removes all remaining additional hardmask layer 210 (see FIG. 5E). The method now picks up with FIG. 1E or 2E Thus the embodiments of the present invention provide a method for forming damascene vias and dual damascene wires with reduced damage to the contact or wire the via is contacting in the lower wiring level and improved via dimensional control due to reduced lateral etch of the interlevel dielectric that defines the via profile.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming a damascene conductor in a dielectric layer on a semiconductor substrate and a dielectric barrier layer on a top surface of said damascene conductor and a top surface of said dielectric layer;
    forming a dielectric stack on a top surface of said dielectric barrier layer, said dielectric stack comprising an interlevel dielectric layer on a top surface of said dielectric barrier layer;
    forming a lower hard mask layer on a top surface of said dielectric stack and an upper hard mask layer on a top surface of said lower hard mask layer;
    using a first reactive ion etch selective to said upper and lower hard mask layers over said interlevel dielectric layer, forming a via opening through said upper hard mask layer and said lower hard mask layer to a top surface of said dielectric stack;
    using a second reactive ion etch selective to said upper hard mask layer and said interlevel dielectric layer over said dielectric barrier layer, extending said via opening through said interlevel dielectric layer to said dielectric barrier layer;
    removing said lower hard mask layer using a wet etch;
    using a third reactive ion etch selective to said dielectric barrier layer over said damascene conductor and said interlevel dielectric layer to said damascene conductor, extending said via opening through said dielectric barrier layer to said damascene conductor; and
    filling said via opening with an electrical conductor.

2. The method of claim 1, wherein said upper hard mask layer comprise a metal nitride and said lower hard mask layer comprises a metal oxide or metal oxynitride.

3. The method of claim 1, wherein said upper hard mask layer comprise titanium nitride and said lower hard mask layer comprises a titanium oxide or titanium oxynitride, said damascene conductor comprises tungsten or copper and said interlevel dielectric layer comprises an ultra low K material have a dielectric constant of 2.7 or less.

4. The method of claim 1, wherein said wet etch comprises an aqueous solution of hydrogen fluoride and citric acid.

5. The method of claim 1, further including:
    between said forming said upper hard mask layer and performing said first reactive ion etch forming a patterned photoresist layer on a top surface of upper hard mask layer, an opening in said patterned hard mask layer defining a perimeter of said via opening and removing said patterned hard mask layer using said second reactive ion etch; or
    between said forming said upper hard mask layer and performing said first reactive ion etch, forming an additional hardmask layer on a top surface of said upper hardmask layer, forming a patterned photoresist layer on a top surface of additional hard mask layer, using said patterned photoresist layer forming an opening in said additional hardmask layer using an additional reactive ion etch, removing said patterned photoresist layer, said opening in said additional hardmask layer defining a perimeter of said via opening, said first reactive ion etch selective to said upper and lower hardmask layers over said additional hardmask layer, said second reactive ion etch removing said additional hardmask layer.

6. The method of claim 1, wherein:
    said interlevel dielectric layer includes a dielectric capping layer on a top surface of said interlevel dielectric layer and said lower hard mask layer is formed on a top surface of said dielectric capping layer;
    said first reactive ion etch is also selective to said upper and lower hard mask layers over said dielectric capping layer and extends said opening to said dielectric capping layer;
    said second reactive ion etch is also selective to said dielectric capping layer over said dielectric barrier layer and extends said opening through said dielectric capping layer; and
    said third reactive ion etch is also selective to said dielectric barrier layer over said dielectric capping layer.

7. The method of claim 6, wherein said upper hard mask layer comprise a metal nitride and said lower hard mask layer comprises a metal oxide or metal oxynitride.

8. The method of claim 6, wherein said upper hard mask layer comprise titanium nitride and said lower hard mask layer comprises a titanium oxide or titanium oxynitride, said damascene conductor comprises tungsten or copper and said interlevel dielectric layer comprises an ultra low K material have a dielectric constant of 2.7 or less.

9. The method of claim 6, wherein said wet etch comprises an aqueous solution of hydrogen fluoride and citric acid between 22° C. and 70° C.

10. The method of claim 6, further including:
    between said forming said upper hard mask layer and performing said first reactive ion etch forming a patterned photoresist layer on a top surface of upper hard mask layer, an opening in said patterned hard mask layer defining a perimeter of said via opening and removing said patterned hard mask layer using said second reactive ion etch; or
    between said forming said upper hard mask layer and performing said first reactive ion etch, forming an additional hardmask layer on a top surface of said upper hardmask layer, forming a patterned photoresist layer on a top surface of additional hard mask layer, using said patterned photoresist layer forming an opening in said additional hardmask layer using an additional reactive ion etch, removing said patterned photoresist layer, said opening in said additional hardmask layer defining a perimeter of said via opening, said first reactive ion etch selective to said upper and lower hardmask layers over said additional hardmask layer, said second reactive ion etch removing said additional hardmask layer.

11. A method, comprising:
forming a damascene conductor in a dielectric layer on a semiconductor substrate and a dielectric barrier layer on a top surface of said damascene conductor and a top surface of said dielectric layer;
forming a dielectric stack on a top surface of said dielectric barrier layer, said dielectric comprising an interlevel dielectric layer on a top surface of said dielectric barrier layer;
forming a lower hard mask layer on a top surface of said dielectric stack and an upper hard mask layer on a top surface of said lower hard mask layer;
using a first reactive ion etch selective to said upper and lower hard mask layers over said interlevel dielectric layer, forming a via opening through said upper hard mask layer and said lower hard mask layer to a top surface of said dielectric stack;
using a second reactive ion etch selective to said upper hard mask layer and said interlevel dielectric layer over said dielectric barrier layer, extending said via opening through said interlevel dielectric layer to said dielectric barrier layer;
removing said lower hard mask layer using a wet etch;
using a third reactive ion etch selective to said interlevel dielectric layer over said dielectric barrier layer, etching a trench part way through said interlevel dielectric layer, said via opening exposed in a bottom of said trench;
using a fourth reactive ion etch selective to said dielectric barrier layer over said damascene conductor and said interlevel dielectric layer to said damascene conductor, extending said via opening through said dielectric barrier layer to said damascene conductor; and
filling said trench and via opening with an electrical conductor.

12. The method of claim 11, wherein said upper hard mask layer comprise a metal nitride and said lower hard mask layer comprises a metal oxide or metal oxynitride.

13. The method of claim 11, wherein said upper hard mask layer comprise titanium nitride and said lower hard mask layer comprises a titanium oxide or titanium oxynitride, said damascene conductor comprises tungsten or copper and said interlevel dielectric layer comprises an ultra low K material have a dielectric constant of 2.7 or less.

14. The method of claim 11, wherein said wet etch comprises an aqueous solution of hydrogen fluoride and citric acid.

15. The method of claim 11, further including:
between performing said wet etch and performing said third reactive ion etch forming a second patterned photoresist layer on a top surface of interlevel dielectric layer, an opening in said second patterned hard mask layer defining a perimeter of said trench and after said third reactive ion etch, removing said second patterned hard mask layer; and
between said forming said upper hard mask layer and performing said first reactive ion etch forming a patterned photoresist layer on a top surface of upper hard mask layer, an opening in said patterned hard mask layer defining a perimeter of said via opening and removing said patterned hard mask layer using said second reactive ion etch; or
between said forming said upper hard mask layer and performing said first reactive ion etch, forming an additional hardmask layer on a top surface of said upper hardmask layer, forming a patterned photoresist layer on a top surface of additional hard mask layer, using said patterned photoresist layer forming an opening in said additional hardmask layer using an additional reactive ion etch, removing said patterned photoresist layer, said opening in said additional hardmask layer defining a perimeter of said via opening, said first reactive ion etch selective to said upper and lower hardmask layers over said additional hardmask layer, said second reactive ion etch removing said additional hardmask layer.

16. The method of claim 11 wherein:
said interlevel dielectric layer includes a dielectric capping layer on a top surface of said interlevel dielectric layer and said lower hard mask layer is formed on a top surface of said dielectric capping layer;
said first reactive ion etch is also selective to said upper and lower hard mask layers over said dielectric capping layer and extends said opening to said dielectric capping layer;
said second reactive ion etch is also selective to said dielectric capping layer over said dielectric barrier layer and extends said opening through said dielectric capping layer
said third reactive ion etch is also selective to said dielectric capping layer over said dielectric barrier layer and extends said trench through said dielectric capping layer;
said fourth reactive ion etch is also selective to said dielectric barrier layer over said dielectric capping layer.

17. The method of claim 16, wherein said upper hard mask layer comprise a metal nitride and said lower hard mask layer comprises a metal oxide or metal oxynitride.

18. The method of claim 16, wherein said upper hard mask layer comprise titanium nitride and said lower hard mask layer comprises a titanium oxide or titanium oxynitride, said damascene conductor comprises tungsten or copper and said interlevel dielectric layer comprises an ultra low K material have a dielectric constant of 2.7 or less.

19. The method of claim 16, wherein said wet etch comprises an aqueous solution of hydrogen fluoride and citric acid between 22° C. and 70° C.

20. The method of claim 16, further including:
between performing said wet etch and performing said third reactive ion etch forming a second patterned photoresist layer on a top surface of interlevel dielectric layer, an opening in said second patterned hard mask layer defining a perimeter of said trench and after said third reactive ion etch, removing said second patterned hard mask layer; and
between said forming said upper hard mask layer and performing said first reactive ion etch forming a patterned photoresist layer on a top surface of upper hard mask layer, an opening in said patterned hard mask layer defining a perimeter of said via opening and removing said patterned hard mask layer using said second reactive ion etch; or
between said forming said upper hard mask layer and performing said first reactive ion etch, forming an additional hardmask layer on a top surface of said upper hardmask layer, forming a patterned photoresist layer on a top surface of additional hard mask layer, using said patterned photoresist layer forming an opening in said additional hardmask layer using an additional reactive ion etch, removing said patterned photoresist layer, said opening in said additional hardmask layer defining a perimeter of said via opening, said first reactive ion etch selective to said upper and lower hardmask layers over said additional hardmask layer, said second reactive ion etch removing said additional hardmask layer.

21. A method, comprising:

providing a substrate having a dielectric barrier layer over an underlying conductor;

forming a dielectric stack on said substrate;

forming a lower hard mask layer comprising a metal and oxygen on a top surface of said dielectric stack and forming an upper hard mask layer on a top surface of said lower hard mask layer;

forming an opening through said upper hard mask layer and said lower hardmask layer;

extending said opening through said dielectric layer to said dielectric barrier layer;

removing said lower hard mask layer using a wet etch;

extending said opening through said dielectric barrier layer to said underlying conductor; and filling said opening with an electrical conductor.

* * * * *